United States Patent
Eugene Lee et al.

(10) Patent No.: US 9,496,206 B2
(45) Date of Patent: Nov. 15, 2016

(54) FLIPPABLE LEADFRAME FOR PACKAGED ELECTRONIC SYSTEM HAVING VERTICALLY STACKED CHIPS AND COMPONENTS

(71) Applicant: Texas Instruments Incorporated, Dallas, TX (US)

(72) Inventors: Lee Han Meng@ Eugene Lee, Johor (MY); Anis Fauzi Bin Abdul Aziz, Melaka (MY); Sueann Lim Wei Fen, Melaka (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/683,277

(22) Filed: Apr. 10, 2015

(65) Prior Publication Data
US 2016/0300784 A1    Oct. 13, 2016

(51) Int. Cl.
| | |
|---|---|
| *H01L 21/00* | (2006.01) |
| *H01L 23/495* | (2006.01) |
| *H01L 21/48* | (2006.01) |
| *H01L 21/56* | (2006.01) |
| *H01L 21/78* | (2006.01) |
| *H01L 23/31* | (2006.01) |

(52) U.S. Cl.
CPC ..... *H01L 23/49555* (2013.01); *H01L 21/4825* (2013.01); *H01L 21/4842* (2013.01); *H01L 21/565* (2013.01); *H01L 21/78* (2013.01); *H01L 23/3114* (2013.01); *H01L 23/49503* (2013.01); *H01L 23/49537* (2013.01)

(58) Field of Classification Search
USPC ........ 438/112, 106, 123, 124, 125, 126, 127
See application file for complete search history.

(56) References Cited

U.S. PATENT DOCUMENTS

| | | | |
|---|---|---|---|
| 5,223,738 A | 6/1993 | Okada | |
| 6,307,755 B1 | 10/2001 | Williams et al. | |
| 2002/0004251 A1 | 1/2002 | Roberts et al. | |
| 2003/0111717 A1* | 6/2003 | Ito | H01L 21/4821 257/678 |
| 2006/0049493 A1 | 3/2006 | Lee et al. | |
| 2013/0127029 A1* | 5/2013 | Lee | H01L 23/49503 257/675 |
| 2013/0249051 A1* | 9/2013 | Saye | H01L 23/49568 257/528 |

* cited by examiner

*Primary Examiner* — Timor Karimy
(74) *Attorney, Agent, or Firm* — Rose Alyssa Keagy; Frank D. Cimino (57) ABSTRACT

A leadframe (100) for electronic systems comprising a first sub-leadframe (110) connected by links (150) to a second sub-leadframe (120), the first and second sub-leadframe connected by tiebars (111, 121) to a frame (130); and each link having a neck (151) suitable for bending the link, the necks arrayed in a line (170) operable as the axis for bending the second sub-leadframe towards the first sub-leadframe with the necks operable as rotation pivots.

6 Claims, 7 Drawing Sheets

FLIPPABLE LEADFRAME FOR PACKAGED ELECTRONIC SYSTEM HAVING VERTICALLY STACKED CHIPS AND COMPONENTS

FIELD

Embodiments of the invention are related in general to the field of semiconductor devices and processes, and more specifically to the structure and fabrication method of packaged electronic systems having a plurality of leadframes, vertically stacked by folding, together with semiconductor chips and passive components.

DESCRIPTION OF RELATED ART

Driven by the desire to reduce the board area needed to assemble a semiconductor device into electronic products such as hand-held telephones, today's semiconductor devices often use vertically stacked chips inside the packages. These chip stacks frequently include chips of significantly different sizes, assembled mostly by wire bonding techniques on interposers commonly made of rigid materials such as ceramics or fiber-enforced plastics such as FR-4 and others.

In applications where a whole system is to be encapsulated into a package, it is desirable to add passive components such as capacitors, resistors, and inductors to the stacked chips and incorporate the components into the package without unduly complicating the vertical stack. A frequently practiced solution for this integration, especially in power and converter systems, is the use of a first and a second metallic leadframe as a means for providing simultaneously the benefit for a significantly higher number of inputs/outputs, for freedom of choosing chips of different sizes and rerouting needs, for higher reliability based on reduced stress on the contact joints and on low-k dielectrics in the chips, and on reduced package warpage, and for reduced package thickness due to avoidance of wire bonding.

When the assembly of the system involves two leadframes sequentially, the process flow needs to pay attention to careful alignment of the second leadframe with the first leadframe—a process which involves a lot of manual handling and control of coplanarity. As an example, in some devices the first leadframe for signal connection involves a high number of leads connected to the chip terminals by a dense array of bonding wires; the signal connections are aligned along two opposite sides of the semiconductor chip. In addition, the power supply is provided by a second leadframe involving a low number of leads, but requiring broad geometry. The power leads are preferably attached by solder balls to the chip and require carful positioning along the remaining two chip sides.

SUMMARY

Applicants realized that in conventional semiconductor manufacturing, the advantage of using two leadframes on semiconductor devices with needs for high density stacking is frequently offset by the disadvantage of excessive manual handling, difficult alignments, and hard-to-control coplanarity. Difficulties of achieving compactness and avoiding misalignment and solder reflow limitations are compiled when passive components have to be merged in close proximity to active chips.

The problems of assembling two separate leadframes with the associate mating process have been solved when applicants discovered a methodology for constructing and processing a single leadframe, which combines both leadframes in an arrangement so that the second leadframe can be rotated and effortless aligned relative to the first leadframe.

In the new leadframe, a first sub-leadframe is connected by links to a second sub-leadframe so that each link has a neck suitable for bending the link. The necks of adjacent links are arrayed in a line operable as an axis for bending the second sub-leadframe towards the first sub-leadframe wherein the necks operable as rotation pivots.

For packaged electronic systems, the first sub-leadframe may include a pad suitable as substrate of an electronic system. The pad may have through-holes extending into grooves across the pad surface. In an encapsulation process, packaging material can be pressed through the through-holes and grooves in order to fill the space between the first and the folded second sub-leadframe with insulating material.

The second sub-leadframe may include leads having wide portions in an area approximately matching the area of the pad, and narrow portions outside the matched area. In the assembly process flow of an electronic system, the second sub-leadframe is folded at the bendable necks so that the second sub-leadframe is rotated around the axis until the second sub-leadframe is aligned on top of the first sub-leadframe and spaced form the first sub=leadframe by a gap. One or more semiconductor chips are disposed between the leads and the pad; and one or more passive components can be attached to the surface of the leads facing away from the chips.

The folded sub-leadframes, together with the attached passive components, can be encapsulated in a packaging compound.

DETAILED DESCRIPTION OF THE PREFERRED EMBODIMENTS

Figure 1:
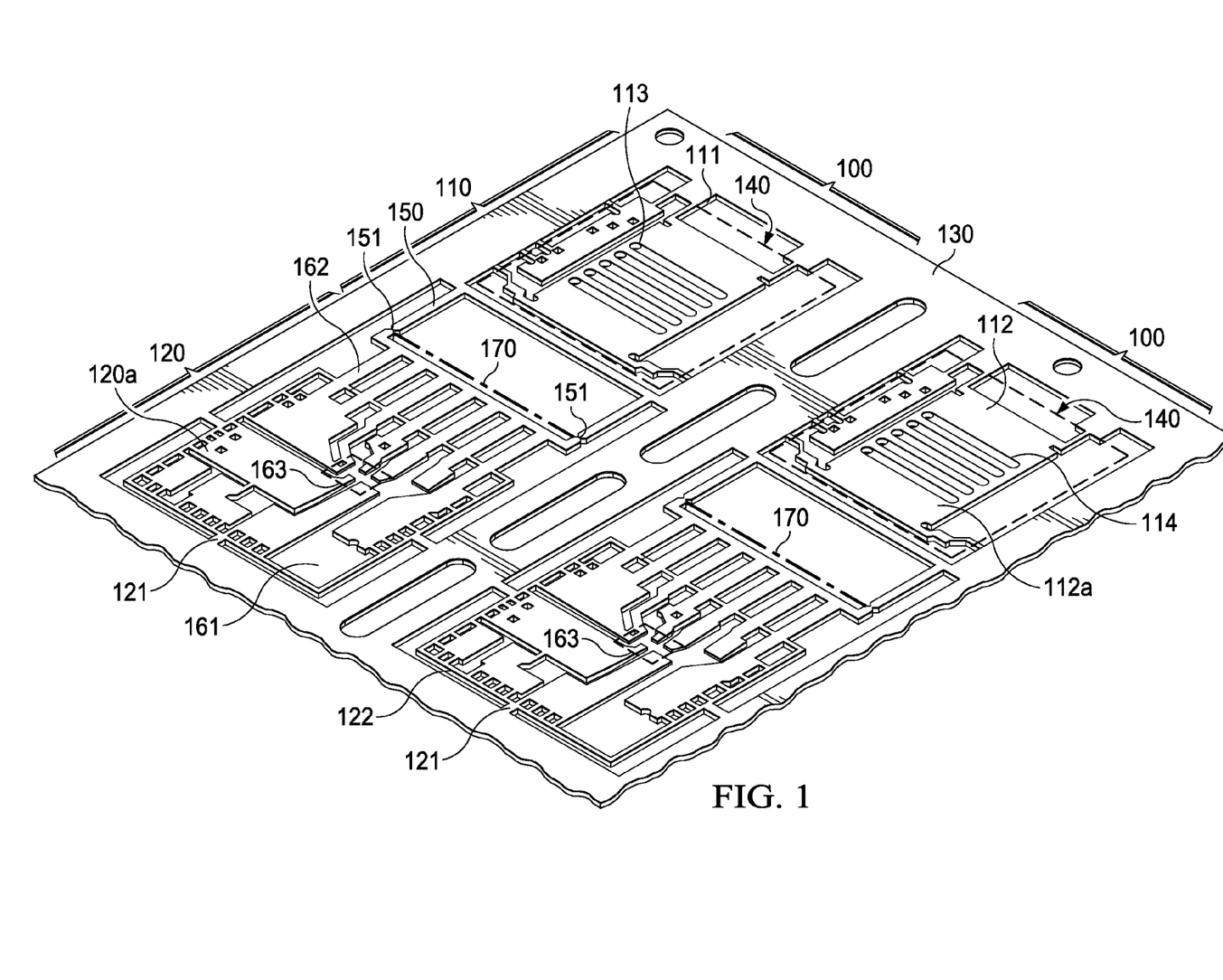
FIG. 1 illustrates the perspective view of a plurality of leadframes, each having a first and a second sub-leadframe connected by links having a neck suitable for bending the link according to the invention.
Figure 2:
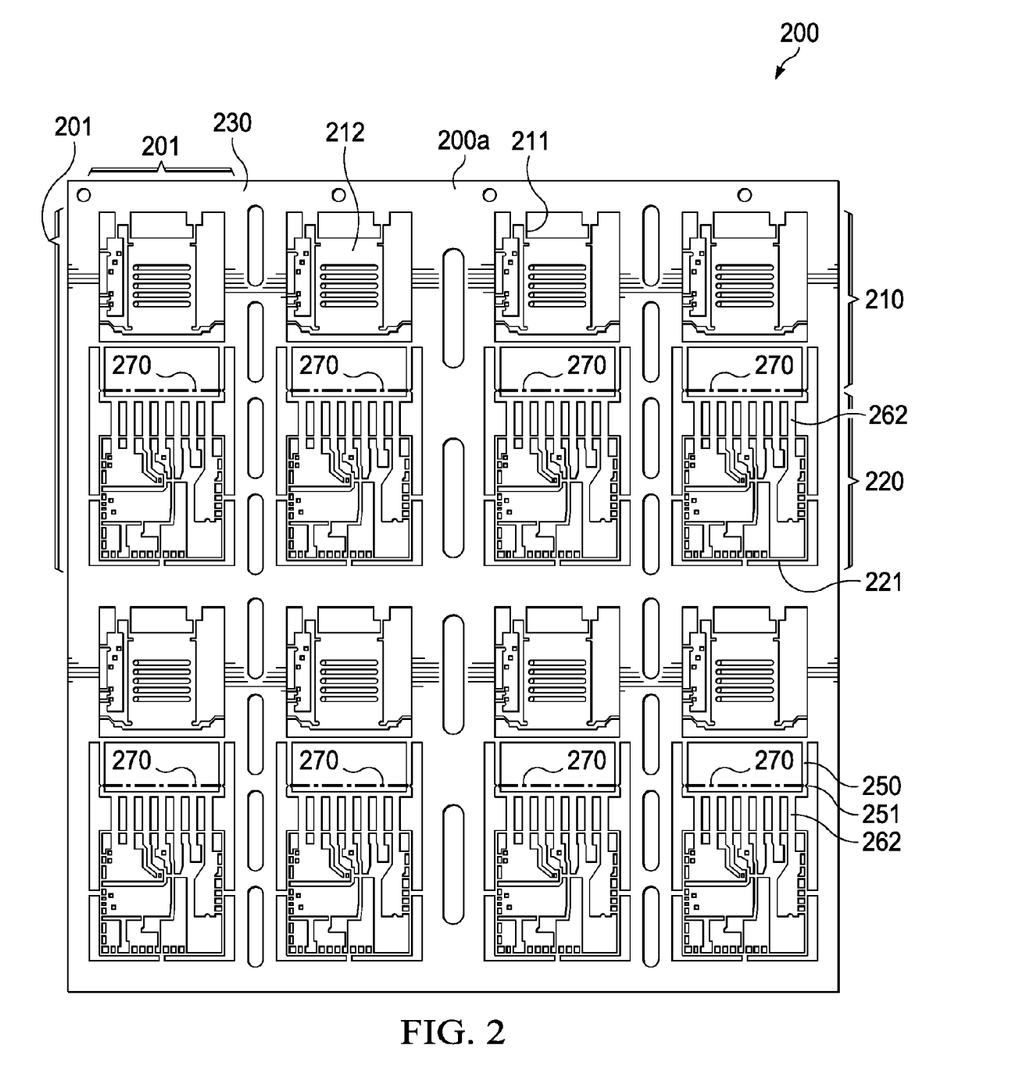
FIG. 2 shows a top view of a leadframe strip including a plurality of leadframes with first and second sub-leadframes.

An exemplary embodiment of the invention is a leadframe as illustrated in FIG. 1 and generally designated 100. For cost-effective manufacturing and enabling batch-processing, it is practical to start with a leadframe strip 200 as shown in FIG. 2, which includes a plurality of leadframes 100. Leadframe strip 200 is stamped or etched from a flat sheet of metal selected from a group including copper, copper alloys, aluminum, iron-nickel alloys, and Kovar™. When the metal sheet is made of copper, the preferred thickness of the sheet is between 100 and 300 µm. For some applications, the sheet may be thicker or thinner. The metal sheet has a first surface and an opposite second surface. In FIGS. 1 and 2, the first surface is depicted and the opposite second surface is nor shown. The metallurgical preparation of the second surface may be the same as the first surface, or it may be different. As an example, one surface, or at least a portion of the surface, may be prepared for facilitating solder attachment; or may be prepared for enhancing adhesion to polymeric compounds.

Generally, leadframe 100 is intended for an electronic system. The system may include at least one active semiconductor chip and one or more passive components. Consequently, the leadframe feature include elements for assembling and supporting semiconductor chips and for assembling and supporting component, as well as interconnecting leads within the leadframe and to external parts, and supporting rails for stability and handling.

Referring now to the embodiment of FIG. 1, each leadframe 100 comprises two sub-leadframes 110 and 120. Herein, sub-leadframe 110 is called first sub-leadframe, and sub-leadframe 120 is called second sub-leadframe. FIG. 1 indicates that first sub-leadframe 110 and second sub-leadframe 120 are connected by tiebars 111 and 121, respectively, to frame 130. Especially tiebars 121 are mechanically weak to allow an easy trimming process. In addition, sub-leadframe 120 is surrounded by dambars 122 for encapsulation control. For explanatory purpose, FIG. 1 includes the outline of the encapsulating package of the finished product.

As FIG. 1 illustrates, first sub-leadframe 110 is connected to second sub-leadframe 120 by a couple of links 150; in other embodiments, there may be more than two links. Each link 150 has a narrow neck 151, which is suitable for allowing easy bending of the link. The plurality (or more) of necks of adjacent links is arrayed in a line 170, which is operable as the axis for bending the second sub-leadframe 120 towards the first sub-leadframe 110 in the assembly process described below, whereby the necks 151 operate as rotation pivots.

For the electronic system realized by the exemplary embodiment of FIG. 1, first sub-leadframe 110 includes a pad 112 suitable as substrate of the electronic system. FIG. 1 shows the first surfaced 112a of pad 112. For the purposes of electrically grounding the system and of dissipating the operational heat, pad 112 is preferably intended to be exposed from the encapsulating package. Consequently, second surface 112b (not shown in FIG. 1) has a metallurgical configuration to enhance solderability, such as a surface layer of nickel followed by a layer of palladium (and a layer of gold).

In FIG. 1, pad 112 further includes through-holes 113, which extend into elongated grooves 114 across first surface 112a. The through-holes and the grooves are suitable for channeling a viscous encapsulation compound. In the encapsulation process (see below), the semi-liquid encapsulation compound is pressured from surface 112b through the holes 113 to surface 112a, where the compound can form an insulating layer between the folded first and second sub-leadframes.

For the electronic system realized in the exemplary embodiment of FIG. 1, second sub-leadframe 120 includes a set of leads, which have wide portions 161 in an area outlined by dashed lines 140, and narrow portions 162 outside the matched area. The area of the wide portion 161 may substantially coincide with the area of pad 112 of the first sub-leadframe. It may be advantageous for the assembly of some embodiments, when some spots 163 of the wide lead portions 161 have recesses relative to first surface 120a; such recesses may facilitate the attachment of semiconductor chip terminals, preferably with the help of solder balls. Sometimes these recesses 163 are referred to as first recesses. In addition, the wide portions of some leads may have recesses relative to the second surface (not shown in FIG. 1; see however FIGS. 4 and 5); such recess may facilitate the attachment of passive components. Sometimes these recesses are referred to as second recesses. Furthermore, it may be advantageous for assembling electronic systems when the first and the second recesses of the wide lead portions have a metallurgical configuration suitable for solder attachment.

Another embodiment of the invention is a method for assembling an electronic system. The method starts by the process of providing a leadframe strip, such as exemplary strip 200 of FIG. 2. The strip has a first surface 200a and an opposite second surface (not shown in FIG. 2). The strip includes a plurality of assembly sites 201. Each site 201 includes a leadframe 230, which holds a pair of sub-leadframes 210 and 220 by tiebars 211 and 221, respectively.

First sub-leadframe 210 is connected by links 250 to second sub-leadframe 220. Each link 250 of the pair has a neck 251 suitable for bending the link. The necks 251 of adjacent links are arrayed in a line 270 operable as the axis for bending the second sub-leadframe 220 towards the first sub-leadframe 210 with the necks 251 operable as rotation pivots.

The exemplary leadframes depicted in strip 200 of FIG. 2 are for an exemplary electronic system analogous to the system described in FIG. 1. Thus, the structure of the first sub-leadframe 210 includes a pad 212 suitable as substrate of the electronic system. As mentioned above, it may be advantageous for many systems that pad 212 includes through-holes, which extend into elongated grooves across the first surface of the pad. These through-holes and the grooves are suitable for channeling a viscous encapsulation compound so that an insulating layer between the folded first and second sub-leadframes can be formed.

The second sub-leadframe 220 includes leads with wide portions 261 of various configurations in an area approximately matching the area of pad 212, and narrow portions 262 outside the matched area; after the packaging process, the narrow lead portions are operable to connect the packaged system to external parts.

Figure 3:
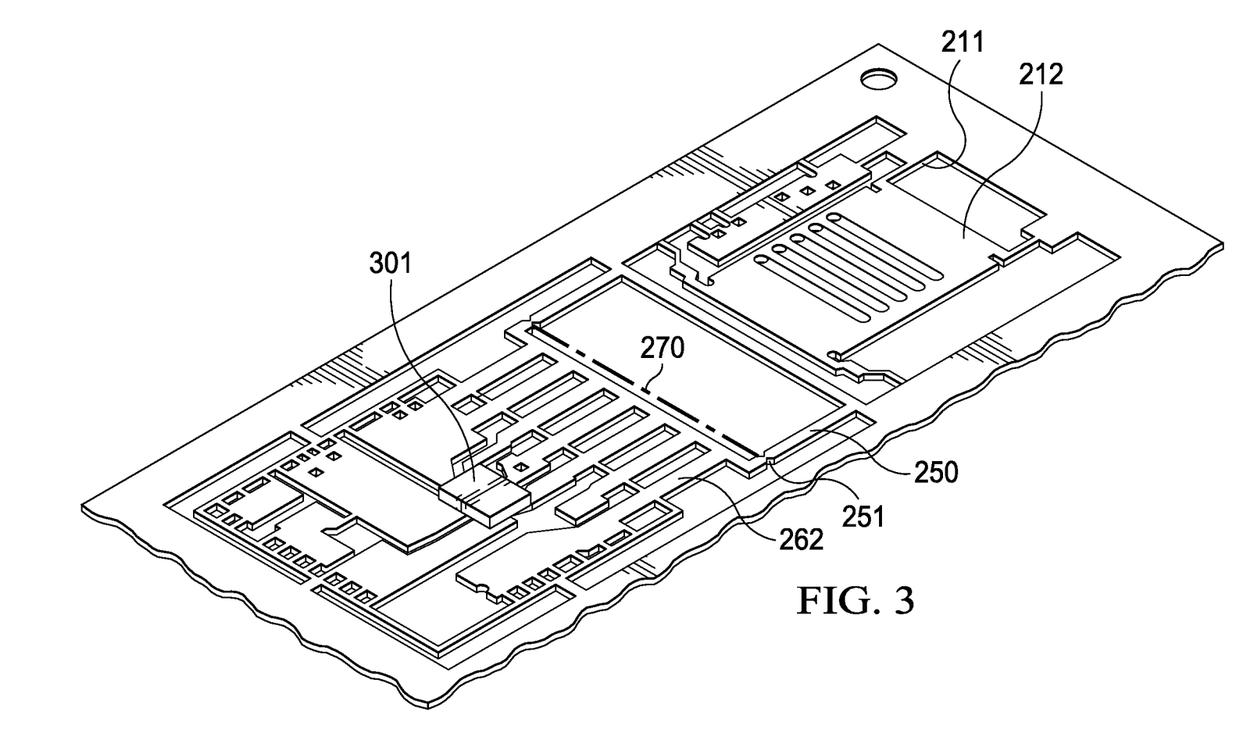
FIG. 3 depicts a perspective view of a leadframe in the process of attaching a semiconductor chip onto the leads of the second sub-leadframe.

The next process is indicated in FIG. 3. A semiconductor chip 301 with terminals is selected. The terminals are connected to the first surface of spots of leads 261, which belong to the wide portion of the leads. These spots may have a suitable recess or a specific metallurgy, such as an enhanced affinity to solder attachment (for example thin layers of nickel and palladium), which facilitates the connection to the chip terminals.

Figure 4:
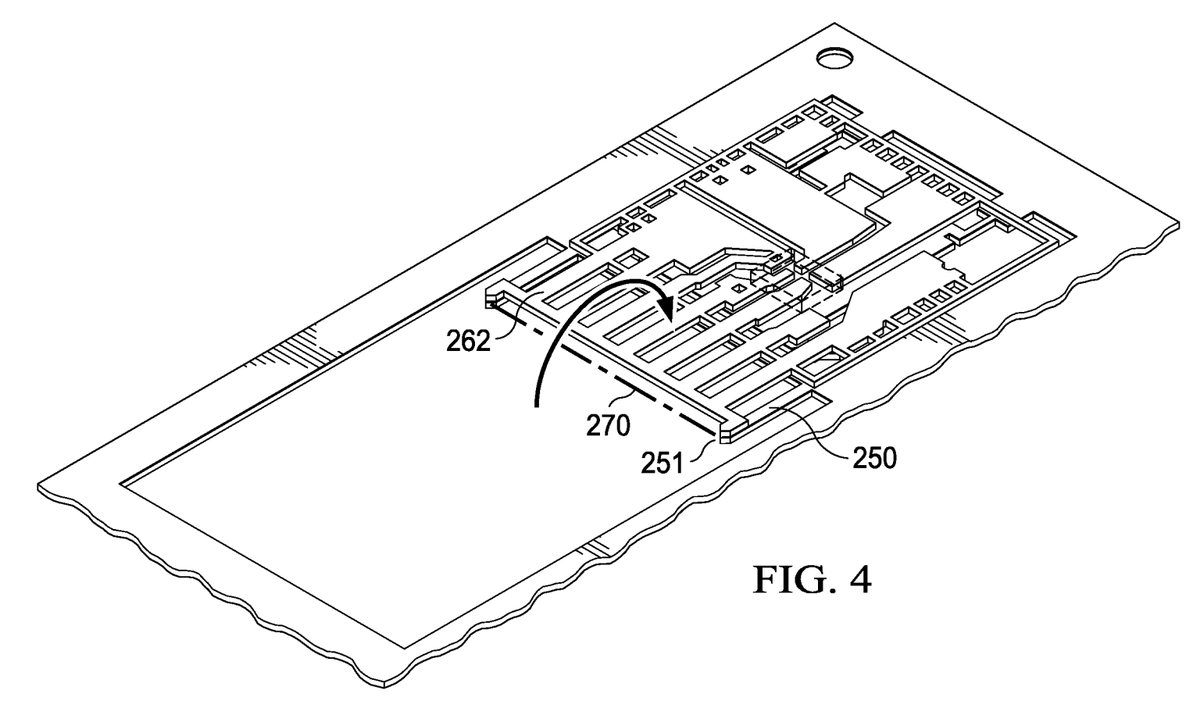
FIG. 4 illustrates the process of folding the second sub-leadframe at the bendable necks to rotate the second sub-leadframe around the axis formed by the aligned necks, until the second sub-leadframe is on top of the first sub-leadframe and spaced from it by a gap.

In the next process, shown in FIG. 4, the tiebars 221, which connect sub-leadframe 220 to frame 230, are trimmed so that sub-leadframe 230 becomes movable. Then, the second sub-leadframe 220 is folded at the bendable necks 251 in order to rotate the second sub-leadframe around the axis constituted by the line 270 running through the necks of adjacent links, until second sub-leadframe 220 is aligned on top of first sub-leadframe 210. In this aligned position, second sub-leadframe 220 is spaced from first sub-leadframe 210 by a gap, while the side of semiconductor chip 301 opposite the attached chip terminals touches the first surface of pad 212. In FIG. 4, the second surface of sub-leadframe 220 is visible and is therefore obscuring the view of the gap and chip 301 disposed between the first and second sub-leadframes.

Figure 5:
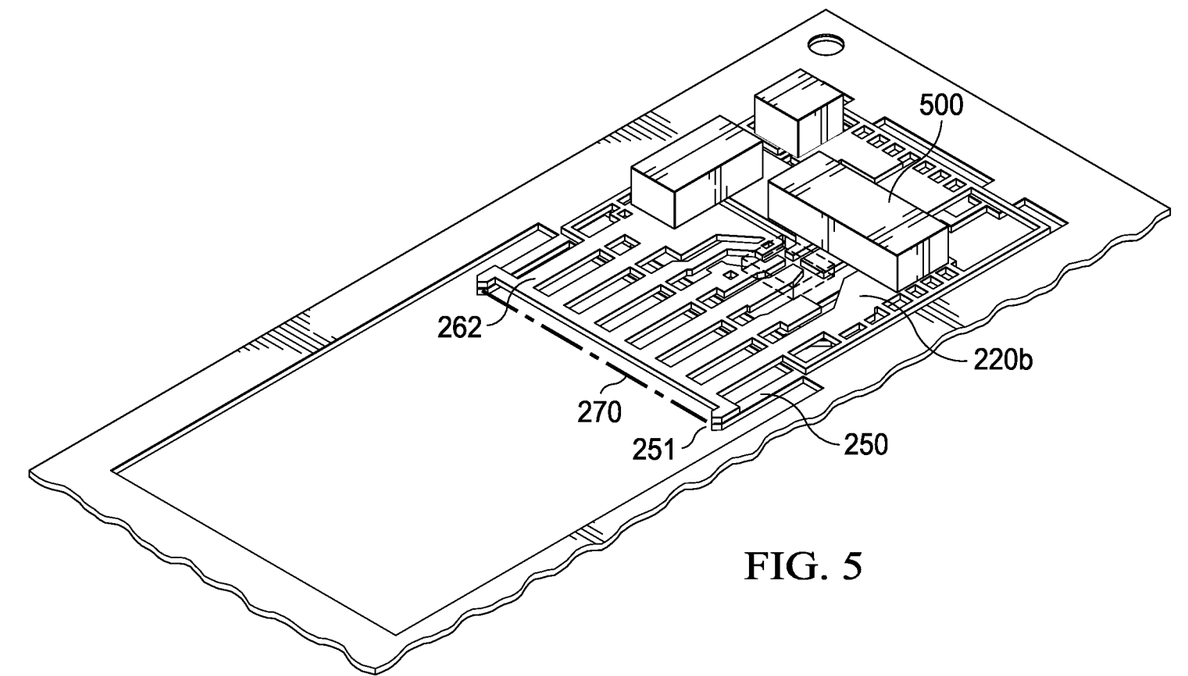
FIG. 5 shows the process of attaching passive components to the second sub-leadframe on the surface facing away from the first sub-leadframe.

FIG. 5 illustrates the next process of attaching one or more discrete components 500 onto the second surface 220b of the second sub-leadframe. The attachment process can be facilitated when the second surface 220b has recesses for the components, and when the recesses further have a surface metallurgy enhancing solder adhesion. For copper leadframes, an example is offered by thin layers of nickel, palladium, and gold.

Figure 6:
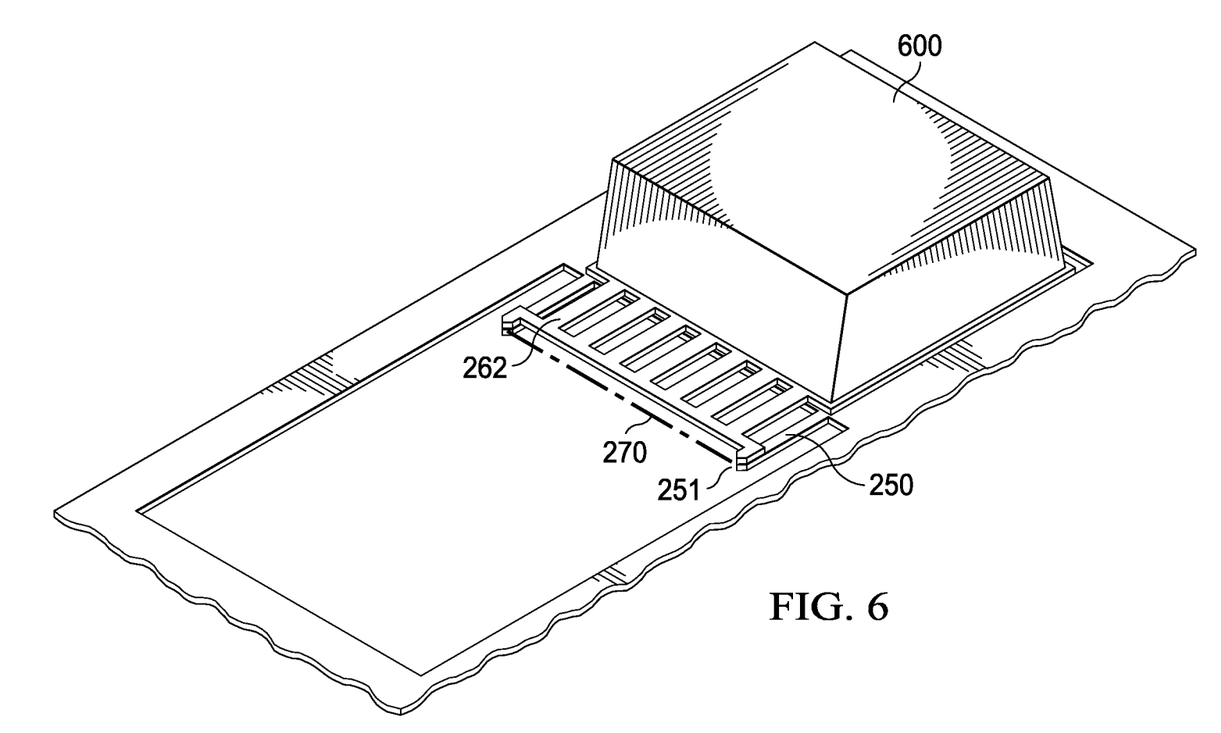
FIG. 6 depicts the process of encapsulating the folded sub-leadframes together with the attached passive components in a packaging compound.

The next procedure, shown in FIG. 6, is the process of encapsulating the folded sub-leadframes 210 and 220 together with the attached passive components in a packaging compound 600. However, the narrow portions 262 of the leads are left un-encapsulated. A preferred process is the transfer molding of an epoxy-based polymeric packaging compound. During the encapsulation process the packaging compound propagates through any through-hole and groove of the pad in order to fill the gap between the first and the second sub-leadframe; in this process, an insulating layer ios formed between the first and second sub-leadframe, except for the chip disposed between the first and second sub-leadframe.

Figure 7A:
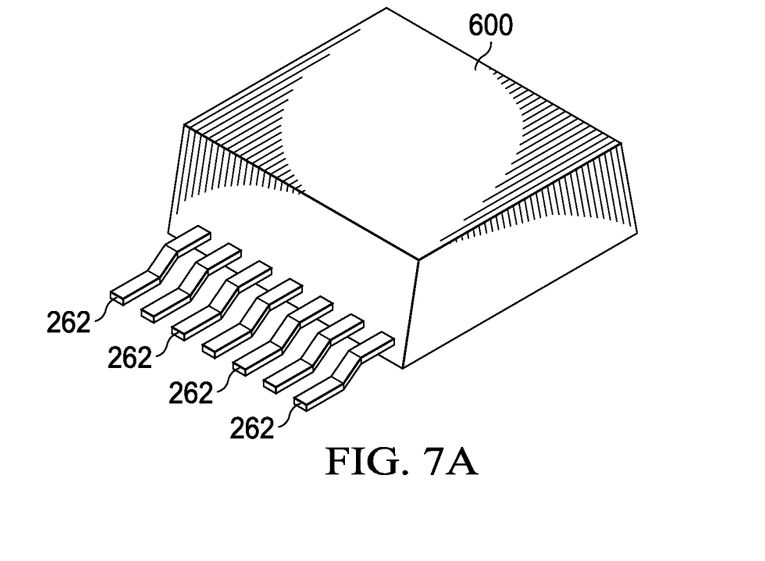
FIG. 7A illustrates a perspective top view of a discrete packaged system after the processes of trimming the first and second sub-leadframes and forming the un-encapsulated leads.
Figure 7B:
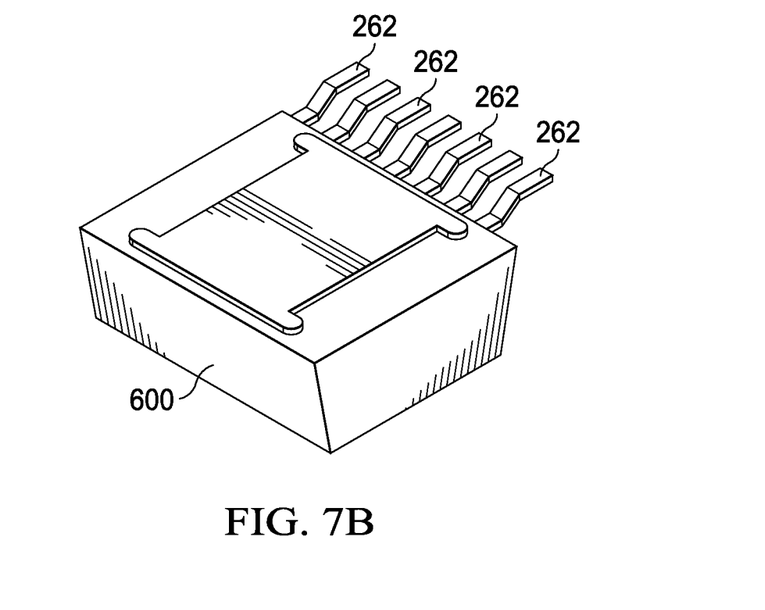
FIG. 7B depicts a perspective bottom view of a discrete packaged system.

In the next process, depicted in FIGS. 7A and 7B, the first and second sub-leadframes are trimmed, and concurrently the un-encapsulated leads are formed. Subsequently, the strip is singulated into discrete packaged electronic systems. FIG. 7A shows a discrete packaged system in perspective top view, and FIG. 7B in perspective bottom view, displaying the second surface of the pad 212 of the first sub-leadframe. Preferably, the second pad surface has a metallurgical configuration for facilitating solder attachment to boards and external parts.

Another embodiment of the invention is a packaged electronic system based on a metallic leadframe. An exemplary embodiment includes a vertical stack, which includes a second sub-leadframe aligned over and insulated from a first sub-leadframe, at least one semiconductor chip disposed between the first and second sub-leadframe, and one or more on top of the second sub-leadframe. In this exemplary system, the first sub-leadframe has a pad suitable to operate as the substrate of the system; as the system substrate, the second surface of the pad preferably has the metallurgical configuration to be solderable to external boards. The second sub-leadframe has leads with narrow and wide portions; preferably, the wide portions have first recesses facing the pad and second recesses facing away from the pad, wherein the recesses preferably have a metallurgical configuration to be solderable. Other systems may use flat leads shaped like in QFN (Quad Flat No-Lead) and SON (Small Outline No-Lead) devices.

The at least one chip of the exemplary system is disposed in the space between the first recesses and the pad. The remainder of the space between first and second sub-leadframe is filled with insulating material. A preferred method of filling the space uses a plurality of holes through the pad to allow ingress of insulating compound during the encapsulation process; the holes feed into an array of grooves across the pad surface so that the compound can spread from the grooves to fill the available space. Discrete components are attached to the second recesses. Topping the vertical stack, the components are in close proximity to the chips, minimizing parasitic resistances and inductances whereby they top the second sub-leadframe. The components may include resistors, capacitors, and inductances.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to active semiconductor devices with low and high pin counts, such as transistors and integrated circuits, but also to combinations of active and passive components on a leadframe pad.

As another example, the invention applies not only to silicon-based semiconductor devices, but also to devices using gallium arsenide, gallium nitride, silicon germanium, and any other semiconductor material employed in industry.

It is therefore intended that the appended claims encompass any such modifications or embodiments.

We claim:

1. A method for assembling an electronic system comprising:
   providing a leadframe strip having a first and a second surface and a plurality of assembly sites, each site including a leadframe with a pair of a first sub-leadframe connected by links to a second sub-leadframe, the pair connected by tiebars to the leadframe; each link of the pair having a neck suitable for bending the link, and the necks arrayed in a line operable as the axis for bending the second sub-leadframe towards the first sub-leadframe with the necks operable as rotation pivots; the first sub-leadframe including a pad suitable as substrate of the electronic system; and the second sub-leadframe including leads having wide portions in an area approximately matching the area of the pad, and narrow portions outside the matched area;
   attaching the terminals of a semiconductor chip to the first surface of the wide portions of the second sub-leadframe;
   trimming the tie-bars to the leadframe of the second sub-leadframe;
   folding the second sub-leadframe at the bendable necks to rotate the second sub-leadframe around the axis until the second sub-leadframe is aligned on top of the first sub-leadframe and spaced from the first sub-leadframe by a gap while the semiconductor chip touches the first surface of the pad; and
   attaching discrete components onto the second surface of the second sub-leadframe.

2. The method of claim 1 wherein the pair of sub-leadframes and the frame are made of a flat metal sheet.

3. The method of claim 2 wherein the pad of the first sub-leadframe includes through-holes extending into elongated grooves across the pad surface, the through-holes and the grooves suitable for channeling a viscous encapsulation compound.

4. The method of claim 3 further including the process of encapsulating the folded sub-leadframes together with the attached passive components in a packaging compound, leaving the narrow portions of the leads un-encapsulated.

5. The method of claim 4 wherein the packaging compound propagates through the through-holes and grooves to fill the gap, forming an insulating layer between the first and second sub-leadframe.

6. The method of claim 3 further including the process of trimming the first and second sub-leadframes, the process of forming the un-encapsulated leads, and the process of singulating the strip into discrete packaged electronic systems.

\* \* \* \* \*